(12) United States Patent
Huang et al.

(10) Patent No.: US 10,468,519 B2
(45) Date of Patent: Nov. 5, 2019

(54) STRUCTURE OF TRENCH METAL-OXIDE-SEMICONDUCTOR FIELD-EFFECT TRANSISTOR

(71) Applicant: NATIONAL TSING HUA UNIVERSITY, Hsinchu (TW)

(72) Inventors: Chih-Fang Huang, Hsinchu (TW); Jheng-Yi Jiang, Hsinchu (TW)

(73) Assignee: NATIONAL TSING HUA UNIVERSITY, Hsinchu (TW)

(*) Notice: Subject to any disclaimer, the term of this patent is extended or adjusted under 35 U.S.C. 154(b) by 0 days.

(21) Appl. No.: 15/961,043

(22) Filed: Apr. 24, 2018

(65) Prior Publication Data

US 2018/0315848 A1 Nov. 1, 2018

(30) Foreign Application Priority Data

Apr. 26, 2017 (TW) .............................. 106113870 A

(51) Int. Cl.
*H01L 29/00* (2006.01)
*H01L 29/78* (2006.01)
(Continued)

(52) U.S. Cl.
CPC ...... *H01L 29/7813* (2013.01); *H01L 29/0623* (2013.01); *H01L 29/0878* (2013.01); *H01L 29/1045* (2013.01); *H01L 29/1083* (2013.01); *H01L 29/1087* (2013.01); *H01L 29/407* (2013.01); *H01L 29/4236* (2013.01); *H01L 29/1095* (2013.01); *H01L 29/1608* (2013.01); *H01L 29/2003* (2013.01)

(58) Field of Classification Search
None
See application file for complete search history.

(56) References Cited

U.S. PATENT DOCUMENTS

| 4,587,712 A | 5/1986 | Baliga |
| 5,168,331 A | 12/1992 | Yilmaz |

(Continued)

FOREIGN PATENT DOCUMENTS

EP 0345380 A2 12/1989

OTHER PUBLICATIONS

Y. Li; J. A. Cooper, Jr., & M. A. Capano, "High-Voltage (3 kV) UMOSFETs in 4H-SiC," IEEE Transactions on Electron Devices, Jun. 2002, pp. 972-975, vol. 49, No. 6.

*Primary Examiner* — Reema Patel
(74) *Attorney, Agent, or Firm* — Muncy, Geissler, Olds & Lowe, PC

(57) ABSTRACT

A structure of a trench metal-oxide-semiconductor field-effect transistor includes an N-current spread layer (N-CSL) disposed on the N-drift region a split gate structure formed in the gate trench and covered by the insulating layer; and a semiconductor protection layer disposed below the bottom of the trench and adjacent to the N-drift region, wherein the insulating layer is disposed above the semiconductor protection layer to protect the insulating layer from being broken through by an electric field when the structure turns off a bias; wherein the gate is separated from the split gate by the insulating layer to form a predetermined gap; and a depth position of a bottom of the trench gate is deeper than an interface between the P-well and the N-current spread layer.

5 Claims, 10 Drawing Sheets

(51) Int. Cl.
 H01L 29/423 (2006.01)
 H01L 29/40 (2006.01)
 H01L 29/10 (2006.01)
 H01L 29/06 (2006.01)
 H01L 29/08 (2006.01)
 H01L 29/20 (2006.01)
 H01L 29/16 (2006.01)

(56) References Cited

U.S. PATENT DOCUMENTS

| | | |
|---|---|---|
| 5,471,075 A | 11/1995 | Shekar et al. |
| 5,488,236 A | 1/1996 | Baliga et al. |
| 5,612,232 A | 3/1997 | Thero et al. |
| 5,744,826 A | 4/1998 | Takeuchi et al. |
| 5,831,288 A | 11/1998 | Singh et al. |
| 6,180,958 B1 | 1/2001 | Cooper, Jr. |
| 7,319,256 B1 | 1/2008 | Kraft et al. |
| 7,385,248 B2 | 6/2008 | Herrick et al. |
| 2008/0017920 A1* | 1/2008 | Sapp ............... H01L 29/407 257/330 |
| 2011/0204436 A1 | 8/2011 | Kraft et al. |
| 2011/0254010 A1 | 10/2011 | Zhang |
| 2013/0113038 A1 | 5/2013 | Hsieh |
| 2016/0359029 A1 | 12/2016 | Zeng et al. |

* cited by examiner

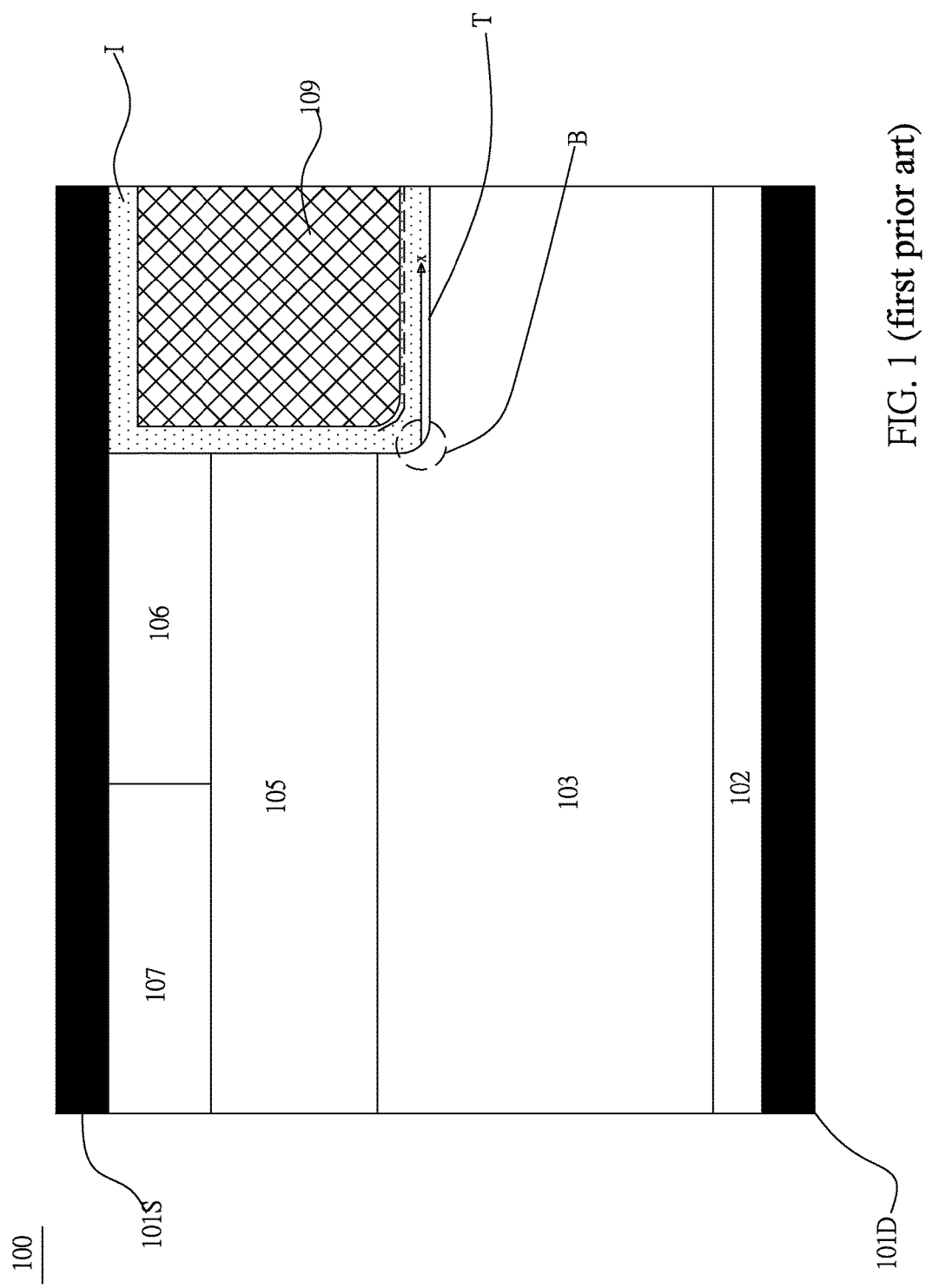
FIG. 1 (first prior art)

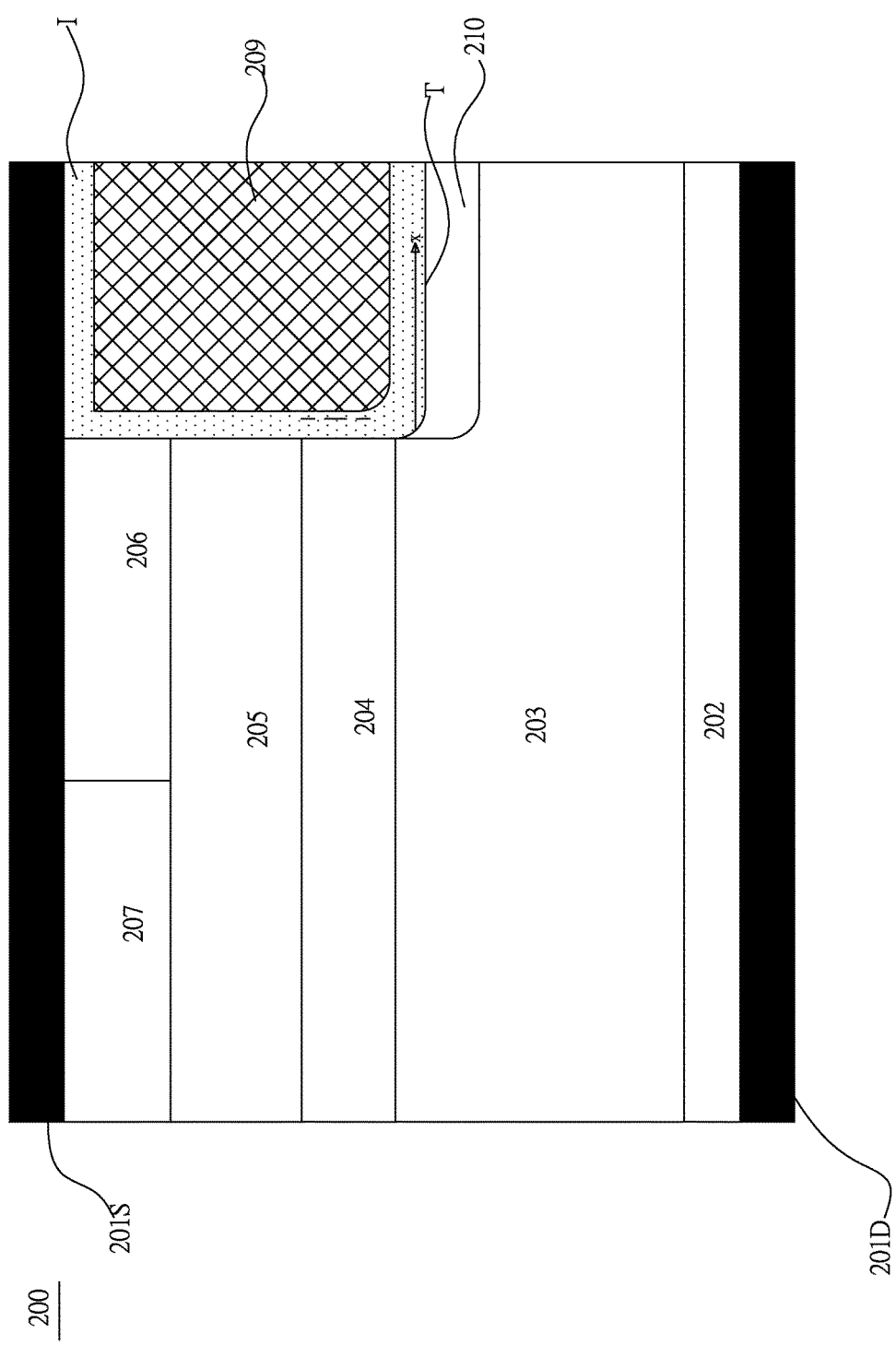
FIG. 2 (second prior art)

STRUCTURE OF TRENCH METAL-OXIDE-SEMICONDUCTOR FIELD-EFFECT TRANSISTOR

BACKGROUND OF THE INVENTION

This application claims priority of No. 106113870 filed in Taiwan R.O.C. on Apr. 26, 2017 under 35 USC 119, the entire content of which is hereby incorporated by reference.

Field of the Invention

The invention relates to a trench metal-oxide-semiconductor field-effect transistor (UMOSFET).

Description of the Related Art

Silicon carbide (SiC) consists of crystals of alternating planar hexagonal lattices of silicon and carbon atoms, and has a wider band than silicon and a much higher critical (or breakdown) electric field. So, the breakdown voltage of the SiC element is better than that of the silicon element. In addition, the typical SiC concurrently has the lower hole concentration and the shorter minority carrier lifetimes, and the shorter minority carrier lifetimes allow the bipolar devices in the SiC to switch more rapidly than the silicon. However, the on-resistance of SiC bipolar transistor cannot be effectively improved. Meanwhile, its drawback is the requirement of the drive current. In contrast, the SiC metal-oxide-semiconductor field-effect transistor (MOSFET) has the advantages of voltage-driving and high-frequency operation.

FIG. 1 is a schematic view showing a UMOSFET structure 100 of a first prior art. Referring to FIG. 1, the structure 100 includes metal layers 101S and 101D, an N-type semiconductor substrate 102, an N-drift region 103, a P-well 105, an N-type semiconductor layer 106, a P-type semiconductor layer 107, a trench T, an insulating layer I and a gate 109. Because the structure 100 of the first prior art has design defects, the critical electric field is generated at a corner B of the structure 100, the insulating layer I at the corner B (depicted by the circular dashed line) is easily damaged by the critical electric field in the off-state. In addition, the gate-drain capacitor Cgd of the structure 100 of FIG. 1 is as shown by the bold dashed line range.

FIG. 2 is a schematic view showing a UMOSFET structure 200 of a second prior art. Referring to FIG. 2, the structure 200 includes metal layers 201S and 201D, an N-type semiconductor substrate 202, an N-drift region 203, an N-current spread layer (N-CSL) 204, a P-well 205, an N-type semiconductor layer 206, a P-type semiconductor layer 207, a trench T, an insulating layer I, a gate 209 and a semiconductor protection layer 210. Although the structure 200 adopts the semiconductor protection layer 210 to improve the drawback that the corner B of FIG. 1 is easily damaged by the critical electric field when the bias is turned off. However, the because the structure 200 has the higher capacitance between the gate terminal and the drain terminal, the longer time is required to charge/discharge when the element is switched between the forward conducting and blocking states. Furthermore, the gate-drain capacitor Cgd thereof is shown by the bold dashed line range, and the range thereof is in the portion of the gate 209 going deeply into the N-CSL 204.

BRIEF SUMMARY OF THE INVENTION

One of the objectives of the invention is to provide a UMOSFET structure having a semiconductor protection layer, which is used to protect the UMOSFET structure from being damaged by the critical electric field.

One of the objectives of the invention is to provide a UMOSFET structure having a current spread layer, which can reduce the resistance value of the UMOSFET structure.

One of the objectives of the invention is to provide a UMOSFET structure having a gate and a split gate to reduce the capacitance of the UMOSFET structure, so that the element between blocking and forward conducting states can be switched rapidly.

The invention provides a structure of a UMOSFET, and the structure includes: a metal layer disposed on a top surface and a bottom surface of the structure to form a source and a drain, respectively, to function as electrodes of the structure connected to an external device; an N-type semiconductor substrate disposed on the drain; an N-drift region disposed on the N-type semiconductor substrate; an N-current spread layer (N-CSL) disposed on the N-drift region; a P-well disposed on the N-CSL; an N-type semiconductor layer disposed on the P-well; a first P-type semiconductor layer adjacent to the N-type semiconductor layer and disposed on the P-well; a trench extending through the N-type semiconductor layer, the P-well and the N-CSL, wherein a bottom of the trench terminates at the N-drift region; an insulating layer disposed in the trench; a split gate disposed in the insulating layer of the trench and covered by the insulating layer; a gate disposed in the insulating layer of the trench and above the split gate; and a semiconductor protection layer disposed below the bottom of the trench and adjacent to the N-drift region, and the insulating layer is disposed above the semiconductor protection layer to protect the insulating layer from being broken through by an electric field when the structure turns off a bias; wherein the gate is separated from the split gate by the insulating layer to form a predetermined gap; and a depth position of a bottom of the gate is deeper than an interface between the P-well and the N-CSL.

BRIEF DESCRIPTION OF THE SEVERAL VIEWS OF THE DRAWINGS

FIG. 1 is a schematic view showing a UMOSFET structure 100 of a first prior art.

FIG. 2 is a schematic view showing a UMOSFET structure 200 of a second prior art.

DETAILED DESCRIPTION OF THE INVENTION

Figure 3A:
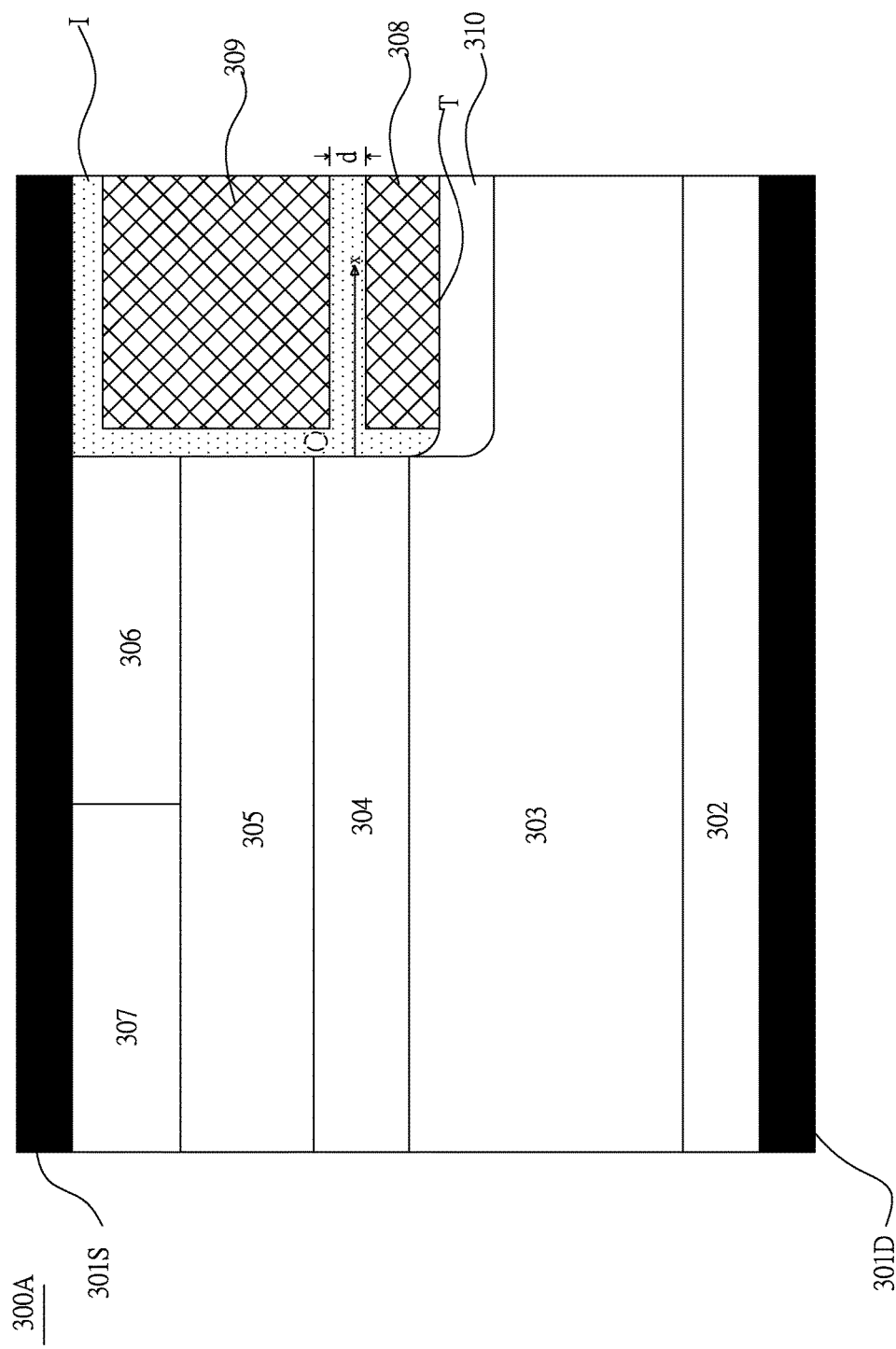
FIG. 3A is a schematically cross-sectional side view showing a UMOSFET structure according to an embodiment of the invention.

FIG. 3A is a schematically cross-sectional side view showing a UMOSFET structure according to an embodiment of the invention. As shown in FIG. 3A, a structure 300A is a structure of a UMOSFET used in SiC in an embodiment.

The structure 300A includes: metal layers 301S and 301D, an N-type semiconductor substrate 302, an N-drift region 303, an N-current spread layer (N-CSL) 304, a P-well 305, an N-type semiconductor layer 306, a P-type semiconductor layer 307, a trench T, an insulating layer I, a split gate 308, a gate 309 and a semiconductor protection layer 310.

The metal layers 301S and 301D are respectively disposed on a top surface and a bottom surface of the structure 300A to form a source and a drain, respectively, to function as electrodes of the structure 300A connected to an external device. The N-type semiconductor substrate 302 is disposed on the drain D. The N-drift region 303 is disposed on the N-type semiconductor substrate 302. The N-current spread layer 304 is disposed on the N-drift region 303. The P-well 305 is disposed on the current spread layer 304. The N-type semiconductor layer 306 is disposed on the P-well 305. The P-type semiconductor layer 307 is adjacent to the N-type semiconductor layer 306 and disposed on the P-well 305. The trench T extends downwards through the N-type semiconductor layer 306, the P-well 305 and the N-current spread layer 304, and finally a bottom of the trench T terminates at the N-drift region 303.

It is to be noted that, in this embodiment, the semiconductor protection layer 310 below the bottom of the trench T is formed by way of ion implantation, and the semiconductor protection layer 310 is adjacent to the N-drift region 303. In this embodiment, the bottom surface of the split gate 308 contacts an upper edge of the semiconductor protection layer 310, the semiconductor protection layer 310 is used to protect the insulating layer I from being destroyed by the breakdown electric field when the structure 300A turns off the bias. In addition, the semiconductor protection layer 310 and the split gate 308 are grounded to prevent a leakage current from being generated between the semiconductor protection layer 310 and the split gate 308.

Note that the semiconductor protection layer 310 is a P-type semiconductor layer in an embodiment, and the semiconductor protection layer 310 and the split gate 308 are grounded. Because the semiconductor protection layer 310 and the split gate 308 have the equal potential, it is possible to prevent the leakage current from being generated between the semiconductor protection layer 310 and the split gate 308.

The semiconductor protection layer 310 is used to protect the insulating layer I from being destroyed by the breakdown electric field when the structure 300A turns off the bias. The insulating layer I is disposed in the trench T, and is adjacent to the N-type semiconductor layer 306, the P-well 305, the N-current spread layer 304, the N-drift region 303 and the semiconductor protection layer 310, respectively. The split gate 308 is disposed in the insulating layer I of the trench, and the gate 309 is disposed in the insulating layer of the trench T and above the split gate 308. The gate 309 and the split gate 308 are separated from each other by the insulating layer I to form a predetermined gap d. A depth position of a bottom of the gate 309 is deeper than an interface between the P-well 305 and the N-current spread layer 304. In an embodiment, the gate 309 and the split gate 308 may be considered as being covered by the insulating layer I. The insulating layer I is implemented by semiconductor oxide or semiconductor nitride, and the split gate 308 and the gate 309 are implemented by polysilicon (poly-Si).

Figure 3B:
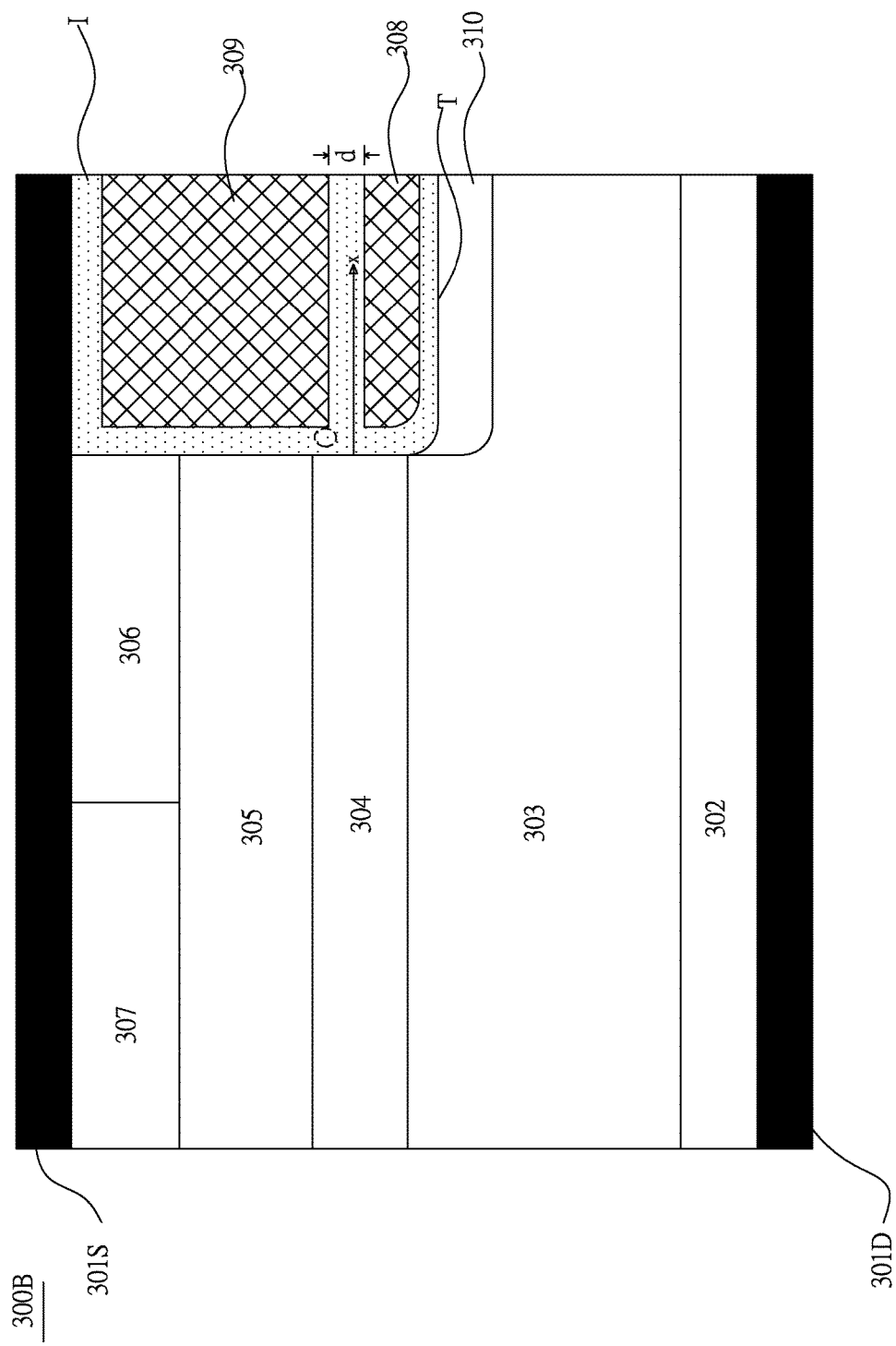
FIG. 3B is a schematically cross-sectional side view showing the UMOSFET structure according to an embodiment of the invention.

FIG. 3B is a schematically cross-sectional side view showing the UMOSFET structure according to an embodiment of the invention. As shown in FIG. 3B, a structure 300B is a structure of a UMOSFET used in SiC in an embodiment.

As previously mentioned, the difference between the structures 300B and 300A is that the insulating layer I is disposed on the semiconductor protection layer 310, the insulating layer I is disposed between the bottom surface of the split gate 308 and the semiconductor protection layer 310. That is, the bottom surface of the split gate 308 does not contact the upper edge of the semiconductor protection layer 310.

In this embodiment, the N-type semiconductor substrate 302, the N-drift region 303, the N-current spread layer 304 and the N-type semiconductor layer 306 are doped with an N-type semiconductor with the concentrations satisfying: the N-drift region 303<the N-current spread layer 304. Because a depletion region is generated in the N-drift region 303 and the N-current spread layer 304 when the structure 300B turns off a bias, and the N-drift region 303 is a high-voltage withstanding component, the N-drift region 303 has the lowest N-type semiconductor concentration.

When the structure 300B is at the forward conducting bias, the source S is grounded, the drain D is connected to a positive voltage, and the gate 309 is also connected to a positive voltage. The electrons flow from the N-type semiconductor layer 306 to the drain D, and the current is uniformly spread through the N-current spread layer 304. In other words, the N-current spread layer 304 increases the current flow and decreases the resistance value of the structure 300B.

Figure 3C:
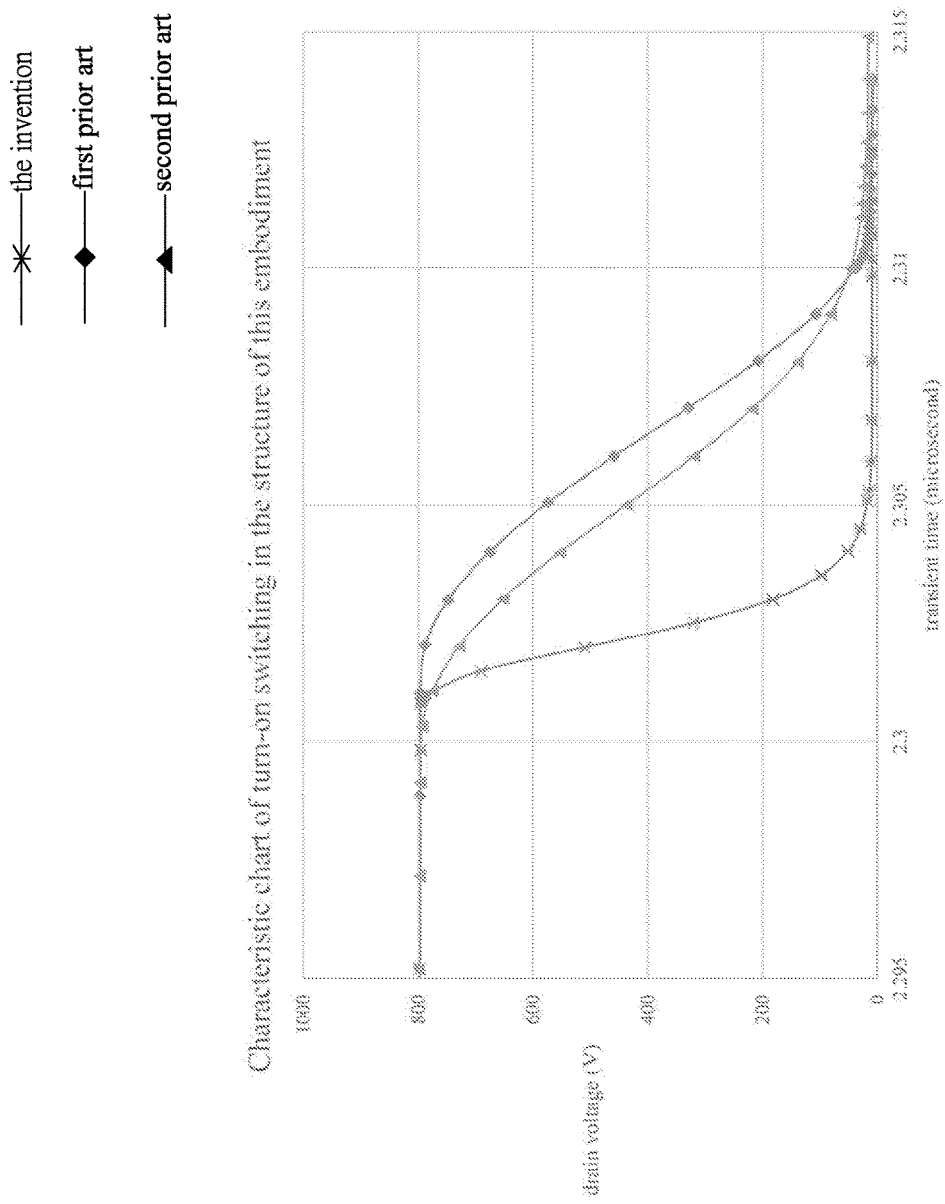
FIG. 3C is an on-switching characteristic chart showing the structure according to an embodiment of the invention.
Figure 3D:
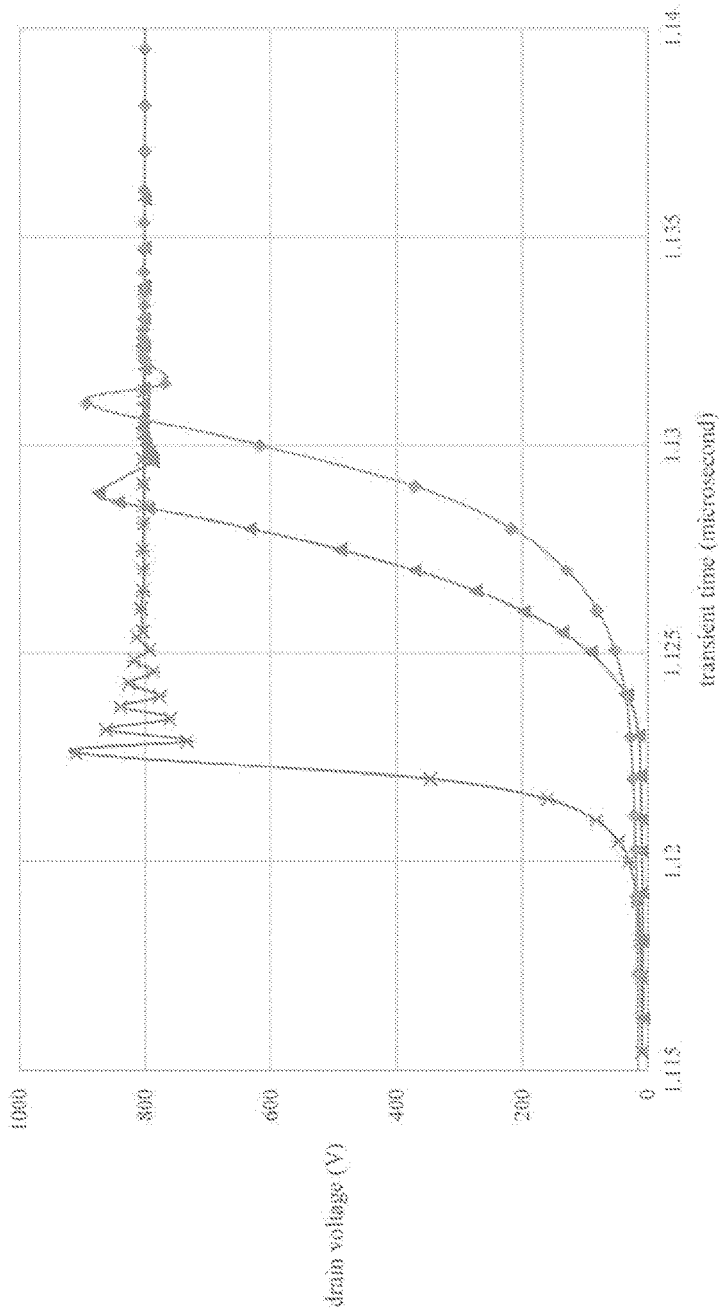
FIG. 3D is an off-switching characteristic chart showing the structure according to an embodiment of the invention.

FIG. 3C is an on-switching characteristic chart showing the structure according to an embodiment of the invention. FIG. 3D is an off-switching characteristic chart showing the structure according to an embodiment of the invention. Please note and also refer to FIGS. 3C and 3D, it is understood that the capacitance between the gate 309 and the split gate 308 is smaller than the capacitance between the gate 309 and the N-current spread layer 304. When the capacitance of the structure 300B is compared with those of the prior arts, the capacitance thereof only corresponds to the gate 309 exceeding the portions of the P-well 305 and the N-current spread layer 304. So, the structure 300B uses the insulating layer I to separate the gate 309 from the split gate 308 to make the capacitance used in the structure 300B be much smaller than those of the prior arts. Consequently, when the structure 300B is switched between the forward conducting and blocking states, the capacitor charging or discharging is faster than those of the prior arts. Regarding this portion, FIGS. 3C and 3D can prove that the charge/discharge speed of the structure of the invention is higher than those of the prior arts.

Furthermore, because the split gate 308 is a metal layer, which is grounded to prevent the gate-drain capacitor Cgd between the gate 309 and the split gate 308 from being generated. So, the gate-drain capacitor Cgd of the invention is much smaller than that of the prior art at only the virtual frame portion. Furthermore, the gate 209 of the structure 200 of the second prior art going deeply into the N-current spread layer 204 by the depth greater than the structure 300B, so the gate-drain capacitor Cgd of the structure 200 is much larger than that of the structure 300B.

A distance (such as the virtual frame) between the gate 309 and the P-well 305 is smaller than a predetermined gap d, and the predetermined gap d is two to ten times of the distance between the gate 309 and the P-well 305.

In the off-state (blocking state), the source S is grounded, the drain D is connected to the positive voltage. At this time, however, the voltage value of the drain D is much higher than the voltage value of the drain D at the forward conducting bias; the voltage of the gate 309 is lowered from the positive voltage to the ground; and the surface of the P-well 305 and the N-current spread layer 304, and the junction of the semiconductor protection layer 310, the N-drift region 303 and the N-current spread layer 304 quickly form a depletion region, and the critical electric field is not formed on the surface of the insulating layer I. In other words, compared with the prior art, the critical electric field is moved downward to the interface between the semiconductor protection layer 310 and the N-drift region 303. Compared with the insulating layer I, because the semiconductor protection layer 310 is made of a high-voltage withstanding material, the semiconductor protection layer 310 is not damaged by the critical electric field to achieve the effect of protecting the insulating layer I.

Figure 4:
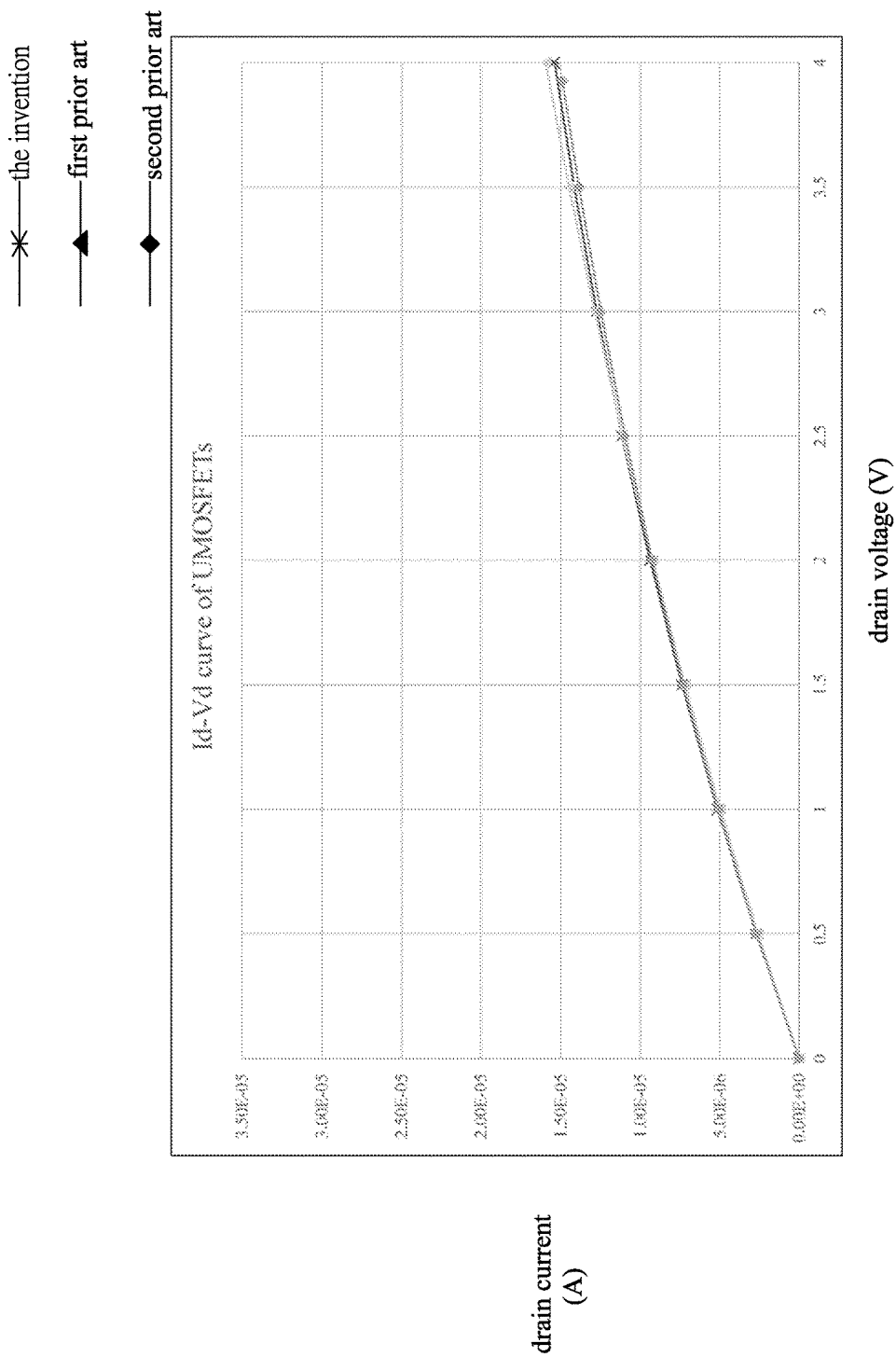
FIG. 4 is a voltage-current comparison chart showing the first prior art of FIG. 1, the second prior art of FIG. 2, and the structure of the invention at the forward conducting bias.

FIG. 4 is a voltage-current chart showing the first prior art of FIG. 1, the second prior art of FIG. 2 and the structure of the invention at the forward conducting bias. Referring to the voltage-current chart of FIG. 4, it is understood that the forward conducting bias of the invention ranges between the first and second prior arts.

Figure 5:
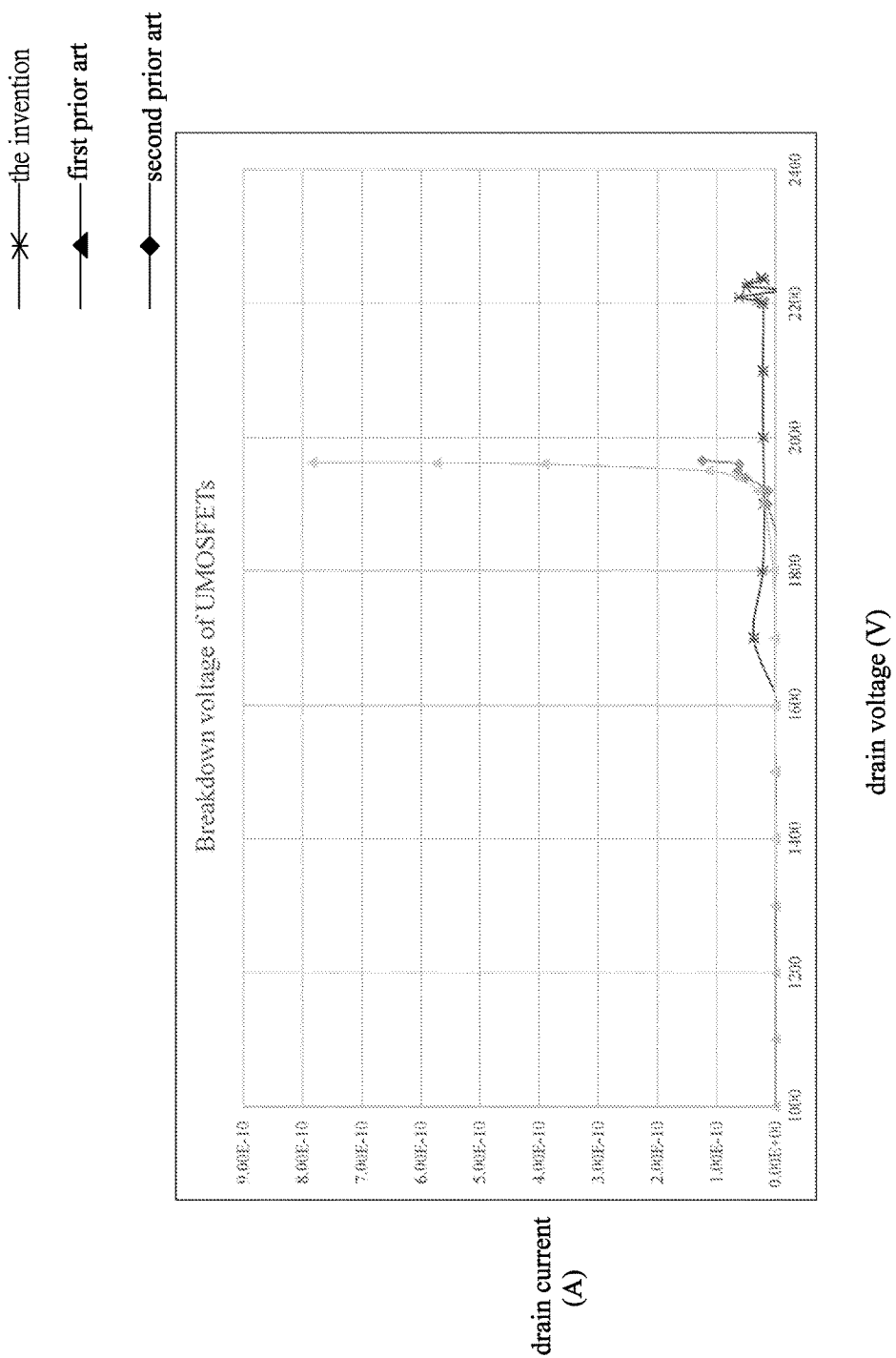
FIG. 5 is a voltage-current comparison chart showing the first prior art of FIG. 1, the second prior art of FIG. 2, and the structure of the invention when the bias is turned off.

FIG. 5 is a voltage-current chart showing the first prior art of FIG. 1, the second prior art of FIG. 2, and the structure of the invention when the bias is turned off. Referring next to FIG. 5, as stated before, the breakdown voltage value of the structure of the invention is higher than those of the first and second prior arts. That is, the structure of the invention can withstand higher voltages than the prior art when the bias is turned off.

Figure 6:
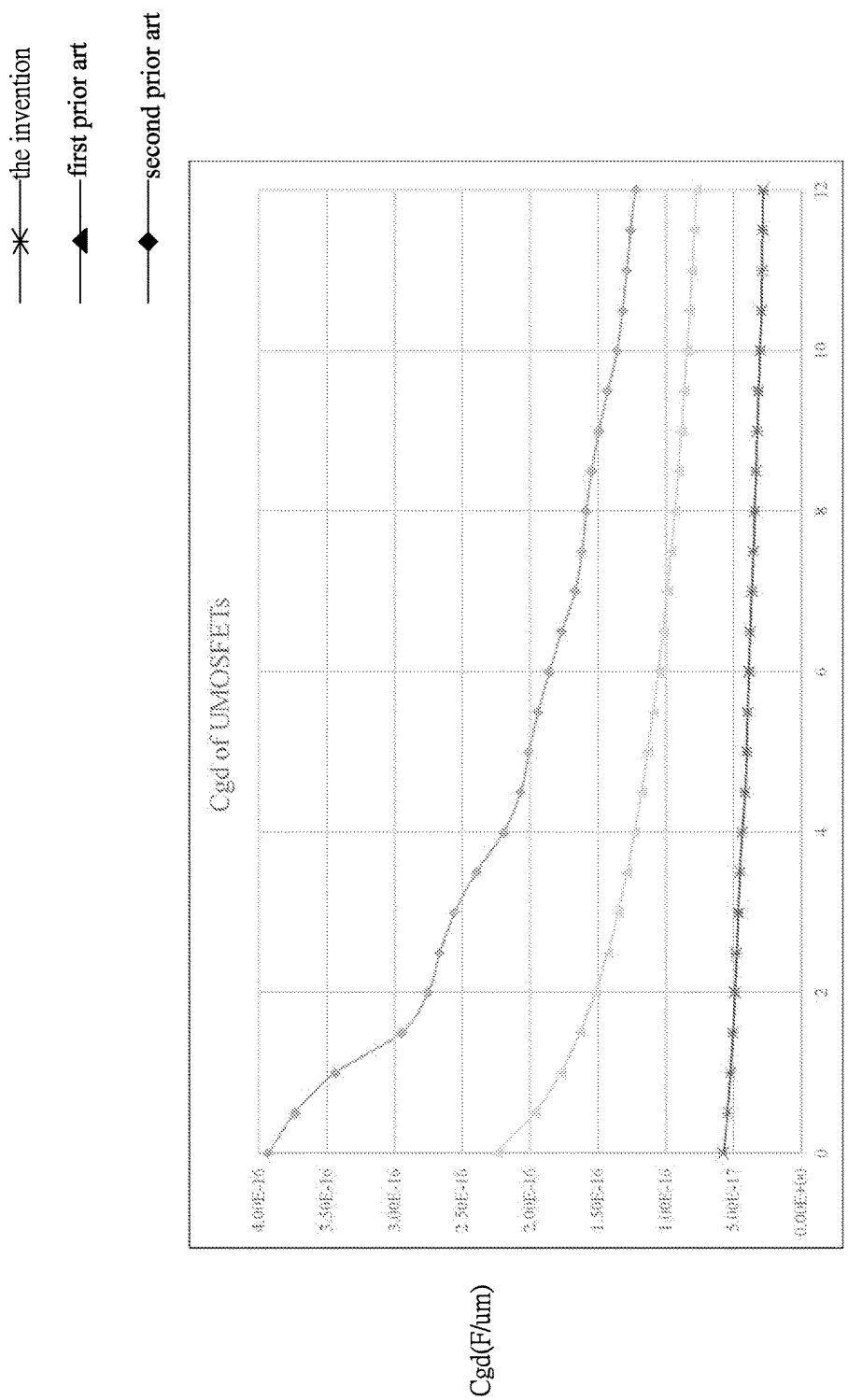
FIG. 6 is a comparison chart showing the capacitances between the gates and the drains in the first prior art of FIG. 1, the second prior art of FIG. 2, and the structure of the invention.

FIG. 6 shows the capacitances between the gates and the drains in the first prior art of FIG. 1, the second prior art of FIG. 2 and the structure of the invention. As can be understood from FIG. 6, the capacitance between the gate and the drain in the structure of the invention is much smaller than those of the first and second prior arts.

Figure 7:
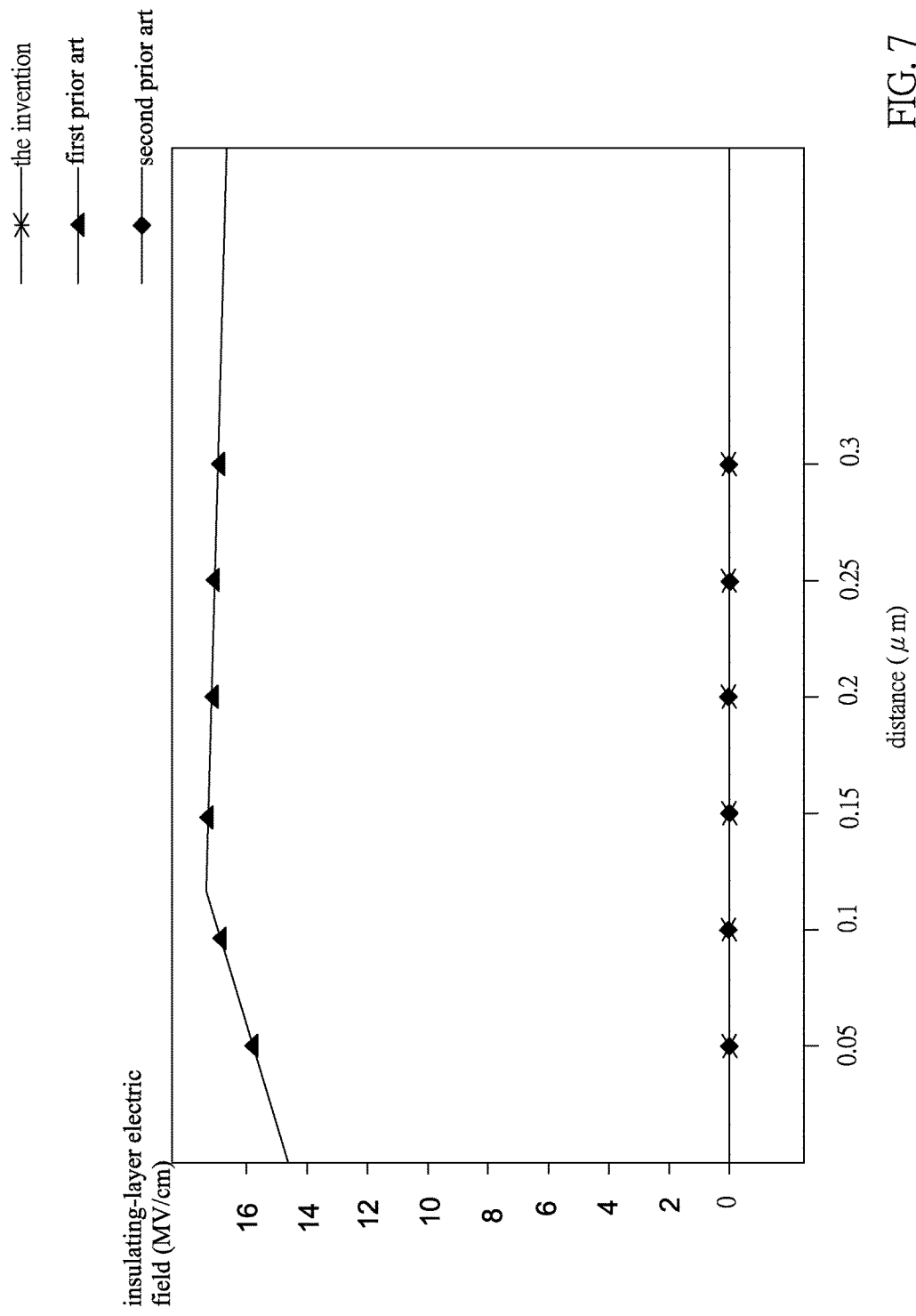
FIG. 7 is a comparison chart showing insulating-layer electric fields in the first prior art of FIG. 1, the second prior art of FIG. 2, and the structure of the invention.

FIG. 7 shows insulating-layer electric fields in the first prior art of FIG. 1, the second prior art of FIG. 2 and the structure of the invention, wherein the abscissa denotes the distance extending from the original, which is the interface between the insulating layer and the N-drift region, to the x axis in each structure diagram. As previously mentioned, the insulating-layer electric fields of the second prior art and the invention are close to zero, and the insulating-layer electric field of the first prior art is much stronger than that of the invention, so the insulating layer of the first prior art will be damaged by the critical electric field.

Note that the structure of the invention is applicable to the material of at least one of silicon carbide (SiC), gallium nitride (GaN) and silicon in an embodiment.

In summary, the invention provides a structure of a trench metal-oxide-semiconductor field-effect transistor, which can withstand the higher voltage than the prior art at the turn-off bias, and has the capacitance smaller than that of the prior art, so that the switching between the forward conducting bias and the turn-off bias becomes faster. Finally, it is possible to effectively protect the insulation layer from being damaged by the critical electric field. Therefore, the invention can eliminate the drawbacks of the prior art.

What is claimed is:

1. A structure of a trench metal-oxide-semiconductor field-effect transistor (UMOSFET), the structure comprising:
   a metal layer disposed on a top surface and a bottom surface of the structure to form a source and a drain, respectively, to function as electrodes of the structure connected to an external device;
   an N-type semiconductor substrate disposed on the drain;
   an N-drift region disposed on the N-type semiconductor substrate;
   an N-current spread layer (N-CSL) disposed on the N-drift region;
   a P-well disposed on the N-CSL;
   an N-type semiconductor layer disposed on the P-well;
   a first P-type semiconductor layer adjacent to the N-type semiconductor layer and disposed on the P-well;
   a trench extending through the N-type semiconductor layer, the P-well and the N-CSL, wherein a bottom of the trench terminates at the N-drift region;
   an insulating layer disposed in the trench;
   a split gate disposed in the insulating layer of the trench and covered by the insulating layer;
   a gate disposed in the insulating layer of the trench and above the split gate; and
   a semiconductor protection layer disposed below the bottom of the trench and adjacent to the N-drift region, wherein the insulating layer is disposed above the semiconductor protection layer to protect the insulating layer from being broken through by an electric field when the structure turns off a bias;
   wherein the gate and the split gate are separated from each other by the insulating layer to form a predetermined gap; and a depth position of a bottom of the gate is deeper than an interface between the P-well and the N-CSL; a bottom surface of the split gate contacts an upper edge of the semiconductor protection layer.

2. The structure of the UMOSFET according to claim 1, wherein the semiconductor protection layer and the split gate are grounded to prevent a leakage current from being generated between the semiconductor protection layer and the split gate.

3. The structure of the UMOSFET according to claim 2, wherein the N-type semiconductor substrate, the N-CSL, the N-drift region and the N-type semiconductor layer are doped with an N-type semiconductor with concentrations satisfying:
   the N-drift region<the N-CSL.

4. The structure of the UMOSFET according to claim 3, wherein a capacitance between the gate and the split gate is smaller than a capacitance between the gate and the N-CSL; and a distance between the gate and the P-well is smaller than the predetermined gap.

5. The structure of the UMOSFET according to claim 4, wherein the semiconductor protection layer is a second P-type semiconductor layer; the structure is applicable to at least one of silicon carbide (SiC), gallium nitride (GaN) and silicon.

* * * * *